(12) United States Patent
Iida et al.

(10) Patent No.: US 10,481,212 B2
(45) Date of Patent: Nov. 19, 2019

(54) SECONDARY BATTERY STATUS ESTIMATION DEVICE AND STATUS ESTIMATION METHOD

(71) Applicant: Panasonic Intellectual Property Management Co., Ltd., Osaka (JP)

(72) Inventors: Takuma Iida, Kanagawa (JP); Takeshi Chiba, Osaka (JP); Shunsuke Nitta, Ishikawa (JP); Kazuhiro Sugie, Shizuoka (JP); Hiroyuki Jimbo, Aichi (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 16 days.

(21) Appl. No.: 15/703,812

(22) Filed: Sep. 13, 2017

(65) Prior Publication Data

US 2018/0003774 A1    Jan. 4, 2018

Related U.S. Application Data

(63) Continuation of application No. PCT/JP2016/001194, filed on Mar. 4, 2016.

(30) Foreign Application Priority Data

Mar. 27, 2015   (JP) .................. 2015-065612

(51) Int. Cl.
*G01R 31/3842*    (2019.01)
*G01R 31/389*    (2019.01)
(Continued)

(52) U.S. Cl.
CPC ....... *G01R 31/3842* (2019.01); *G01R 31/389* (2019.01); *H01M 10/48* (2013.01);
(Continued)

(58) Field of Classification Search
CPC ............... G01R 31/3624; G01R 31/36; G01R 31/3627; H01M 10/48; H01M 10/06; H01M 2220/20; Y02E 60/126; H02J 7/1461
(Continued)

(56) References Cited

U.S. PATENT DOCUMENTS 7,197,487 B2 *   3/2007   Hansen ................ G01R 31/367
                                                            706/25
7,656,122 B2 *   2/2010   Plett ................... G01R 31/3648
                                                            320/128
(Continued)

FOREIGN PATENT DOCUMENTS

JP    2004-025982 A    1/2004
JP    2011-257214 A    12/2011

OTHER PUBLICATIONS

International Search Report of PCT application No. PCT/JP2016/001194 dated May 24, 2016.

*Primary Examiner* — M Baye Diao
(74) *Attorney, Agent, or Firm* — Seed IP Law Group LLP

(57) ABSTRACT

A secondary battery status estimation device includes a sensor unit configured to detect a terminal voltage of a secondary battery, and an internal resistance calculator configured to calculate a direct current internal resistance of the secondary battery based on the terminal voltage and the charge-discharge current detected by the sensor unit. The internal resistance calculator calculates a direct current internal resistance based on the terminal voltage and the charge-discharge current detected by the sensor unit, in a stable period that is before starting a driving source for driving a vehicle and in which the terminal voltage and the charge-discharge current of the secondary battery fall within a predetermined fluctuation range, and in a high-current output period in which electric power for starting the driving (Continued)

source is output from the secondary battery and the terminal voltage of the secondary battery is brought to substantially minimum.

7 Claims, 6 Drawing Sheets

(51) Int. Cl.
- *H01M 10/48* (2006.01)
- *G01R 31/385* (2019.01)
- *H01M 10/06* (2006.01)
- *H02J 7/14* (2006.01)

(52) U.S. Cl.
CPC .......... *G01R 31/385* (2019.01); *H01M 10/06* (2013.01); *H01M 2220/20* (2013.01); *H02J 7/1461* (2013.01); *Y02E 60/126* (2013.01)

(58) Field of Classification Search
USPC ....................................................... 320/137
See application file for complete search history.

(56) References Cited

U.S. PATENT DOCUMENTS

| | | | |
|---|---|---|---|
| 8,103,485 B2* | 1/2012 | Plett | H01M 10/48 703/2 |
| 8,738,311 B2* | 5/2014 | Wu | G01R 31/367 702/63 |
| 10,145,898 B2* | 12/2018 | Chen | H02J 7/0029 |
| 2009/0146664 A1* | 6/2009 | Zhang | G01R 31/392 324/433 |
| 2013/0134778 A1* | 5/2013 | Tamanaha | B60L 3/12 307/10.1 |
| 2013/0241480 A1* | 9/2013 | Kirimoto | B60L 58/15 320/109 |
| 2016/0041229 A1* | 2/2016 | Park | G01R 31/3842 702/63 |

\* cited by examiner

SECONDARY BATTERY STATUS ESTIMATION DEVICE AND STATUS ESTIMATION METHOD

CROSS-REFERENCE TO RELATED APPLICATIONS

This application is a continuation of the PCT International Application No. PCT/JP2016/001194 filed on Mar. 4, 2016, which claims the benefit of foreign priority of Japanese patent application No. 2015-065612 filed on Mar. 27, 2015, the contents all of which are incorporated herein by reference.

BACKGROUND

1. Technical Field

The present disclosure relates to a secondary battery status estimation device and a secondary battery status estimation method.

2. Description of the Related Art

A vehicle equipped with an engine as its main driving source incorporates a secondary battery as an electric power source for starting up the engine. The engine is started by driving of a starter motor. Generally, a lead-acid battery is used as the secondary battery.

In recent years, a start-stop system has been employed to reduce the emission of the vehicle equipped with an engine as its main driving source.

When the start-stop system uses a secondary battery that has undergone performance degradation, the start-stop system may not function properly. In order to prevent such a problem of the secondary battery beforehand, there has been a device for estimating the status of the secondary battery incorporated in the vehicle (see, for example, Japanese Patent Unexamined Publication No. 2011-257214: hereinafter referred as PTL 1).

The battery status estimation device of PTL 1 is equipped with a small full scale current sensor to calculate parameters of the battery status using the values of the voltage and current of the secondary battery before the starter switch is turned on.

SUMMARY

A secondary battery status estimation device according to an embodiment of the present disclosure employs the following configuration. That is, the status estimation device includes a sensor unit configured to detect a terminal voltage and a charge-discharge current of a secondary battery, and an internal resistance calculator configured to calculate a direct current internal resistance of the secondary battery based on the terminal voltage and the charge-discharge current both detected by the sensor unit. The internal resistance calculator calculates the direct current internal resistance based on the terminal voltage and the charge-discharge current both detected by the sensor unit in the following Period 1 and Period 2. Period 1: A stable period that is before starting a driving source for driving a vehicle and in which the terminal voltage and the charge-discharge current of the secondary battery fall within a predetermined fluctuation range. Period 2: A high-current output period in which, when starting the driving source, electric power for starting the driving source is output from the secondary battery and the terminal voltage of the secondary battery is brought to substantially minimum.

A secondary battery status estimation method according to an embodiment of the present disclosure includes: detecting a terminal voltage and a charge-discharge current of a secondary battery, and calculating a direct current internal resistance of the secondary battery based on the detected terminal voltage and the detected charge-discharge current. When calculating the direct current internal resistance, the direct current internal resistance is calculated in the following Period 1 and Period 2, based on the detected terminal voltage and the detected charge-discharge current. Period 1: A stable period that is before starting a driving source for driving a vehicle and in which the terminal voltage and the charge-discharge current of the secondary battery fall within a predetermined fluctuation range. Period 2: A high-current output period in which, when starting the driving source, electric power for starting the driving source is output from the secondary battery and the terminal voltage of the secondary battery is brought to substantially minimum.

According to the present disclosure, the direct current internal resistance of a secondary battery is calculated using the values detected when a high charge-discharge current occurs. Therefore, it is possible to estimate, with high accuracy, the status of the secondary battery at the time when the high current is output, using the calculated direct current internal resistance.

DETAILED DESCRIPTION OF PREFERRED EMBODIMENTS

Prior to describing the various exemplary embodiments, problems of the related art are briefly described.

Upon starting a starter motor, very high inrush current occurs, which causes the secondary battery to undergo a significant voltage drop. When the voltage of the secondary battery falls below a certain value due to the voltage drop, various problems may arise such that the engine does not start up or the engine control unit (ECU) is reset. Accordingly, there is a need for accurately estimating the performance of the secondary battery at the time when extremely high current occurs, such as at the time of starting the starter motor.

However, the battery status estimation device of PTL 1 obtains the battery status parameters using the values of the voltage and current of the secondary battery before the period at which the starter switch is turned on. Consequently the battery status parameters obtained by the battery status estimation device of PTL 1 cannot deal with the time constant of an abrupt voltage change that occurs when a high current is output. Thus, there is a problem that the estimation accuracy is poor when estimating the status of a secondary battery using these parameters.

Hereafter, exemplary embodiments of the present disclosure will be described in detail with reference to the drawings.

First Exemplary Embodiment

Figure 1:
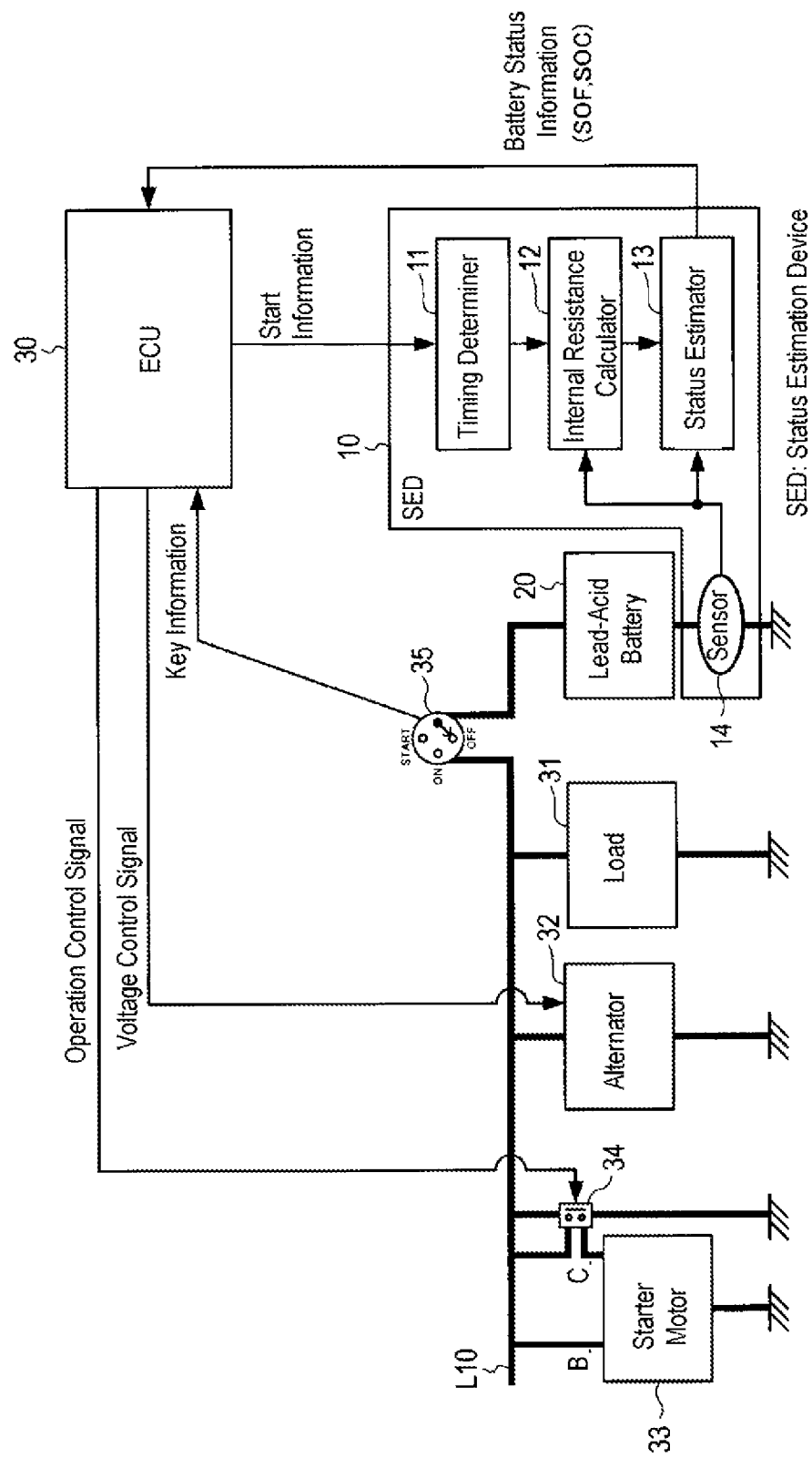
FIG. 1 is a block diagram illustrating a status estimation device according to a first exemplary embodiment of the present disclosure and a portion of a vehicle.

FIG. 1 is a block diagram illustrating status estimation device 10 according to a first exemplary embodiment of the present disclosure and a portion of a vehicle.

Secondary battery status estimation device 10 is incorporated in a vehicle that is driven mainly by the power of an engine. The vehicle includes status estimation device 10, lead-acid battery 20 as a secondary battery, ECU (Electronic Control Unit) 30, load 31, alternator 32, starter motor 33, relay 34, and ignition key 35. Although not shown in the drawing, the vehicle has an engine and driving wheels. The vehicle may have a start-stop system, which requires more accurate estimation of the secondary battery status at the time of cranking.

Starter motor 33 is a motor for starting the engine. Starter motor 33 drives a crankshaft to rotate, which starts an engine cycle, and thereby the engine starts up. Rotating of the crankshaft of the engine that is driven by starter motor 33 is called "cranking".

Relay 34 is a switch for starting starter motor 33. When relay 34 is turned ON and a voltage is output to C terminal of starter motor 33, the internal status of starter motor 33 is switched so that a current is input from B terminal, causing starter motor 33 to start rotating. Relay 34 is switched between ON and OFF by electric power from lead-acid battery 20, based on, for example, an operation control signal from ECU 30.

Alternator 32 generates electric power employing the rotational power of the crankshaft. Alternator 32 may generate the electric power employing the rotational power of the driving wheels. In addition, alternator 32 rectifies the generated power and adjusts the voltage based on a voltage control signal from ECU 30.

Load 31 is, for example, electrical auxiliary equipment necessary for operating the engine, including a fuel injection system and spark plugs, for example. The term auxiliary equipment means peripheral equipment other than the engine itself, and the auxiliary equipment is necessary for operating the engine. Load 31 may include various electrical apparatuses incorporated in the vehicle, such as in-vehicle lights, an instrument panel, and a lighting system.

Ignition key 35 is operated by a driver, for switching connection between lead-acid battery 20 and power line L10, which is connected to load 31, alternator 32, and starter motor 33. For example, when ignition key 35 is turned to OFF, the connection is cut off, while when ignition key 35 is turned to ON, the connection is established. When ignition key 35 is turned to START, starter motor 33 is started. The state of ignition key 35 is conveyed to ECU 30 as key information.

Lead-acid battery 20 is capable of being charged and discharged, and corresponds to an example of the secondary battery according to the present disclosure. Lead-acid battery 20 is charged by electric power from alternator 32. Lead-acid battery 20 supplies electric power to starter motor 33, relay 34, load 31, and ECU 30 when ignition key 35 is at ON or START. Lead-acid battery 20 supplies electric power to status estimation device 10 irrespective of the position of ignition key 35.

ECU 30 controls the engine. Specifically, ECU 30 controls the operation of starter motor 33, the auxiliary equipment, and the voltage of the generated power by alternator 32. In addition, ECU 30 receives battery status information of lead-acid battery 20 from status estimation device 10 to control operations based on the battery status information from status estimation device 10. The battery status information includes a state of function (SOF). The battery status information may further include a state of charge (SOC). The state of function is an index that indicates the capability of the battery whether or not a specified voltage can be maintained when the battery outputs an assumed high current. Based on the battery status information, ECU 30 may control operations for the start-stop system when the state of function is higher than a predetermined first threshold value, and prohibits the control of the start-stop system and issues a warning when the state of function is lower than a predetermined second threshold value. In the first exemplary embodiment, ECU 30 also transmits start information indicating the timing for starting starter motor 33 to status estimation device 10.

Status estimation device 10 estimates the state of function (SOF) as the status of lead-acid battery 20. Status estimation device 10 may further estimate the state of charge (SOC) of lead-acid battery 20.

Status estimation device 10 includes timing determiner 11, internal resistance calculator 12, status estimator 13, and sensor unit 14. Except for the elements of the sensor unit 14 (such as resistors for detecting current), the various function blocks of status estimation device 10 may be constructed as a single-chip semiconductor integrated circuit. Alternatively, except for the elements of the sensor unit 14, status estimation device 10 may be constructed of a plurality of semiconductor integrated circuits. Yet alternatively, a portion of status estimation device 10, or the whole of status estimation device 10 except for the elements of the sensor unit 14, may be constructed of a single semiconductor integrated circuit, together with ECU 30 or another ECU incorporated in the vehicle. Furthermore, a plurality of function blocks of status estimation device 10 may be integrated into a single function block. Moreover, the various function blocks of status estimation device 10 may be constructed of respective dedicated circuits or general-purpose circuits formed of a central processor unit, memory and the like and software for controlling the circuits.

Sensor unit 14 detects a voltage and a charge-discharge current of lead-acid battery 20, and outputs a detection signal to internal resistance calculator 12 and status estimator 13. The voltage to be detected may be the terminal voltage of lead-acid battery 20 when it is being charged, the terminal voltage thereof when it is being discharged, and the terminal voltage thereof when the circuit is open.

Based on the start information sent from ECU 30, timing determiner 11 determines a timing at which starter motor 33 starts, and notifies internal resistance calculator 12 of the timing.

Based on the timing notified by timing determiner 11, internal resistance calculator 12 receives the detected values of the voltage and charge-discharge current of lead-acid battery 20 from sensor unit 14, and calculates the direct current internal resistance (MIR) of lead-acid battery 20 using the detected values. The details of the internal resistance calculation process will be described later.

Based on the values detected by sensor unit 14 and the direct current internal resistance calculated by internal resistance calculator 12, status estimator 13 estimates the battery status such as the state of function (SOF) and the state of charge (SOC).

The state of function indicates the estimated value of the voltage drop of lead-acid battery 20 when a high current is output to starter motor 33. Status estimator 13 obtains the state of function by carrying out the calculation as shown in the following equation (1).

$$Vf=Vc-(Ib-Ic)\times Ri \qquad (1)$$

Here, Vf is the state of function, Vc is the closed circuit voltage (CCV) of lead-acid battery 20 before cranking, Ib is the charge-discharge current at the last-moment just before the time of cranking, Ic is the maximum charge-discharge current assumed at the time of cranking, and Ri is the direct current internal resistance.

Status estimator 13 outputs the information of the estimated battery status to ECU 30.

Internal Resistance Calculation Process

Next, a method of calculating a direct current internal resistance of lead-acid battery 20 by internal resistance calculator 12 will be described.

Figure 2:
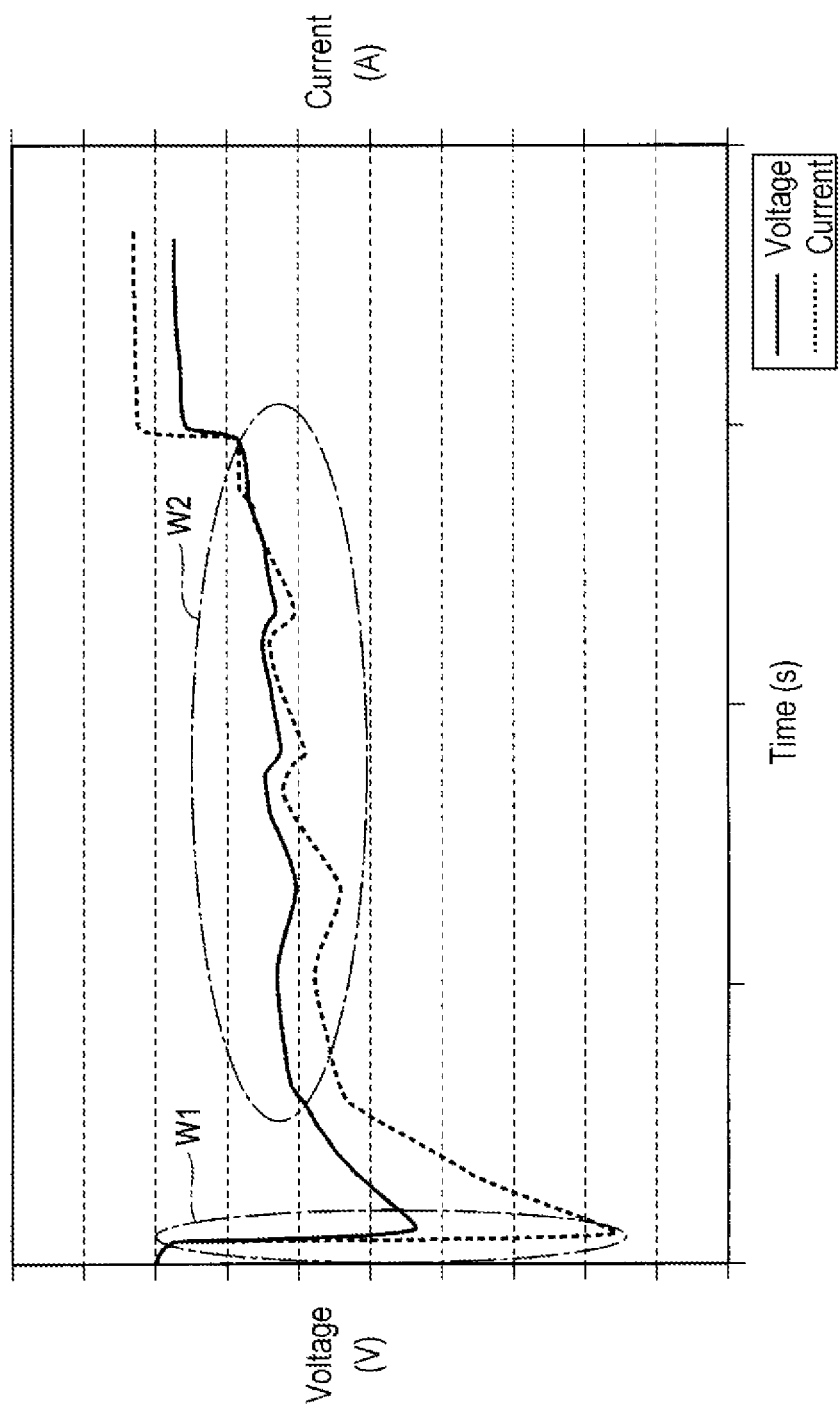
FIG. 2 is a graph illustrating terminal voltage and charge-discharge current of a secondary battery at the time of cranking.
Figure 3:
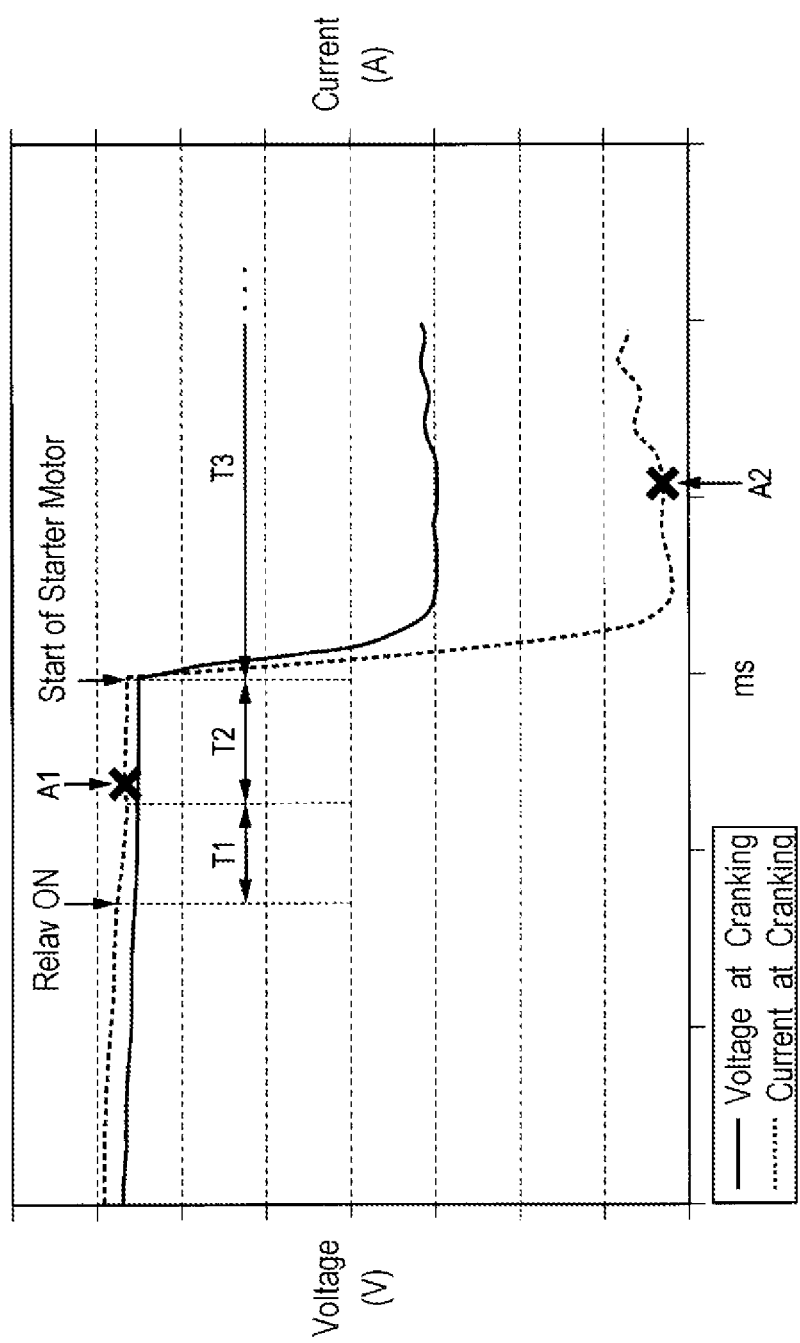
FIG. 3 is an enlarged graph showing an area W1 in FIG. 2.

FIG. 2 is a graph illustrating terminal voltage and charge-discharge current of the secondary battery at the time of cranking. FIG. 3 is an enlarged graph showing an area W1 in FIG. 3.

Internal resistance calculator 12 calculates the direct current internal resistance according to a two-point method. In the two-point method, the direct current internal resistance is calculated by the following equation (2), using the voltage and charge-discharge current of lead-acid battery 20 detected at the first timing and those detected at the second timing.

$$Ri=(V1-V2)/(I1-I2) \qquad (2)$$

Here, Ri is the direct current internal resistance, V1 is the voltage at the first timing, V2 is the voltage at the second timing, I1 is the charge-discharge current at the first timing, and I2 is the charge-discharge current at the second timing.

As the timing for acquiring the voltage and charge-discharge current, predetermined timing before and after cranking is employed as will be described subsequently.

At the time of cranking, very high current flows through starter motor 33 when starter motor 33 starts to rotate, as indicated by region W1 in FIG. 2. Subsequently, as indicated by region W2 in FIG. 2, after a period in which starter motor 33 and the crank of the engine rotate several times, the engine starts up. Next, the operation of starter motor 33 at the time of starting will be described in more detail.

When starting starter motor 33, first, ECU 30 outputs an operation control signal for switching relay 34 to ON. As shown in FIG. 3, relay 34 physically moves the contact point in a very short period T1 so as to be switched from OFF to ON. In this period T1, a physical operation is caused by electric power, so that the operating voltage and current of relay 34 changes relatively significantly.

When relay 34 is turned to an ON-state, a voltage is output to C terminal of starter motor 33. Thereafter, subsequent to a very short stable period T2, a high current flows into B terminal of starter motor 33, causing starter motor 33 to start rotating. In this stable period T2, the current that is output to relay 34 is stabilized, so that the voltage of lead-acid battery 20 is accordingly stabilized. In this stable period T2, the terminal voltage and charge-discharge current of lead-acid battery 20 fall within a predetermined fluctuation range. The phrase "to fall within a predetermined fluctuation range" means that the fluctuation range is so small that the effect of reducing the influence of the charge polarization of lead-acid battery 20 on the open circuit voltage (OCV) can be obtained.

Internal resistance calculator 12 sets any timing in stable period T2 before cranking to be first timing A1 and acquires the detected values of the voltage and charge-discharge current from sensor unit 14.

In subsequent period T3, in which starter motor 33 starts, abrupt current is output to starter motor 33, and consequently, a voltage drop of lead-acid battery 20 occurs.

Internal resistance calculator 12 sets the timing at which the voltage drops substantially to the lowest level at the time of cranking to be second timing A2, at which it acquires the detected values of the voltage charge-discharge current from sensor unit 14. Then, from the values detected at first timing A1 and the values detected at second timing A2, the direct current internal resistance of lead-acid battery 20 is calculated using the foregoing equation (2).

The use of the values detected at first timing A1 within stable period T2, during which the current output is stable, enables calculation of the direct current internal resistance with the reduced influence of the polarization of lead-acid battery 20. Also, the use of the values detected at second timing A2 at which high current is output at the time of cranking enables calculation of the direct current internal resistance that can deal with the time constant of a large current change that occurs at the time of cranking.

Figure 4:
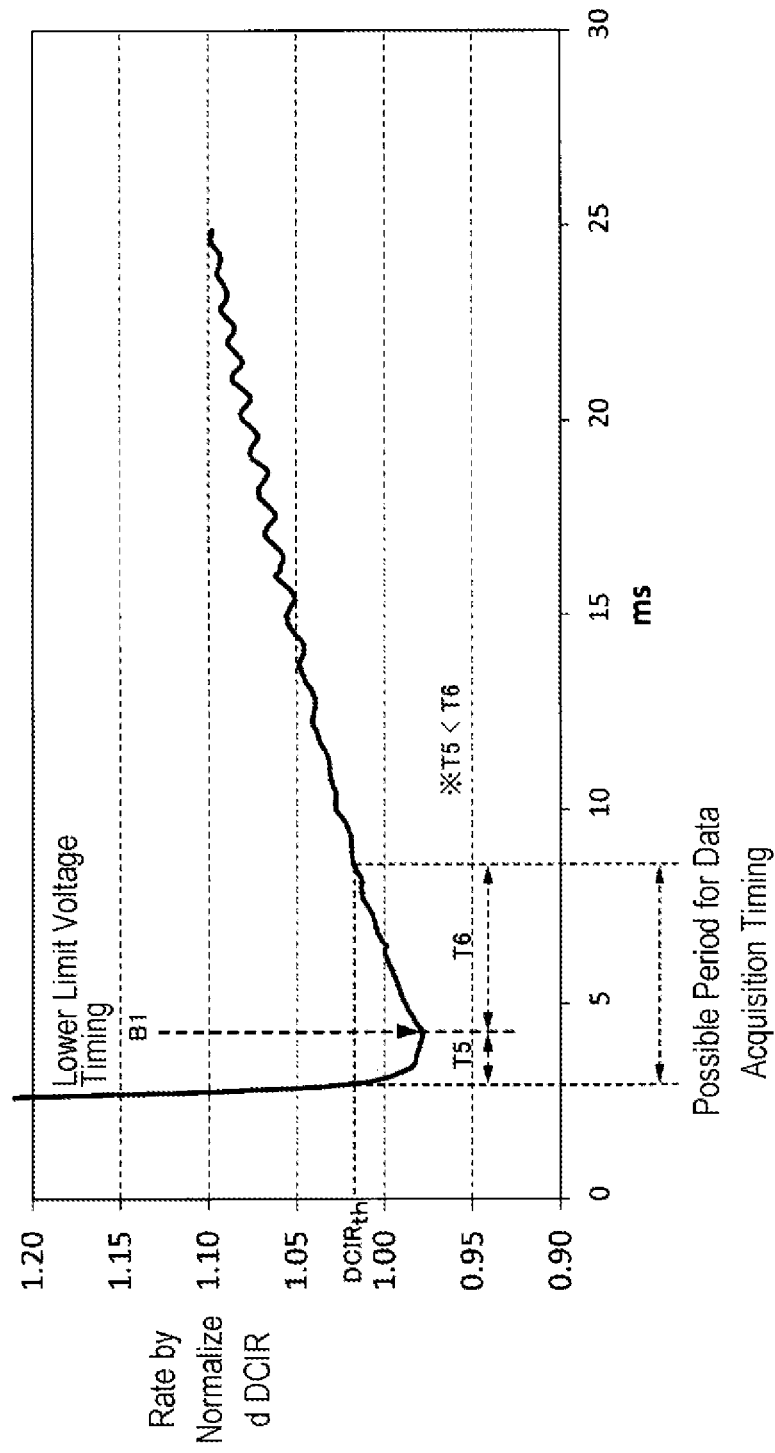
FIG. 4 is a graph for illustrating data acquisition timing.

FIG. 4 is a graph for illustrating data acquisition timing.

Second timing A2, at which the voltage drops substantially to the lowest voltage at the time of cranking, may be timing B1 at which the voltage has actuarially dropped to the lowest voltage as shown in FIG. 4, or may be a slightly different timing before or after this timing B1. As the slightly different timing before or after timing B1, it is possible to employ a timing within allowable error period T5 before timing B1 and a timing within allowable error period T6 after timing B1. These allowable error periods T5 and T6 correspond to a high-current output period in which the terminal voltage of lead-acid battery 20 is substantially minimum.

Allowable error period T5 before timing B2 is, for example, 5 ms, and more preferably 3 ms. Allowable error period T6 after timing B2 is, for example, 15 ms, and more preferably 10 ms. Typically, earlier allowable error period T5 is shorter than later allowable error period T6.

The calculated direct current internal resistance changes according to change of second timing A2 for acquiring the detected values within the ranges of allowable error periods T5 and T6. Nevertheless, by employing allowable error periods T5 and T6 as described above, the calculated result of the direct current internal resistance does not exceed allowable error threshold value DCIRth of the direct current internal resistance.

As described above, secondary battery status estimation device 10 enables calculation of the direct current internal resistance of a secondary battery using values that are detected when a high charge-discharge current occurs. Therefore, it is possible to estimate, with high accuracy, the status of the secondary battery at the time when the high current is output, using the calculated direct current internal resistance.

Second Exemplary Embodiment

Figure 5:
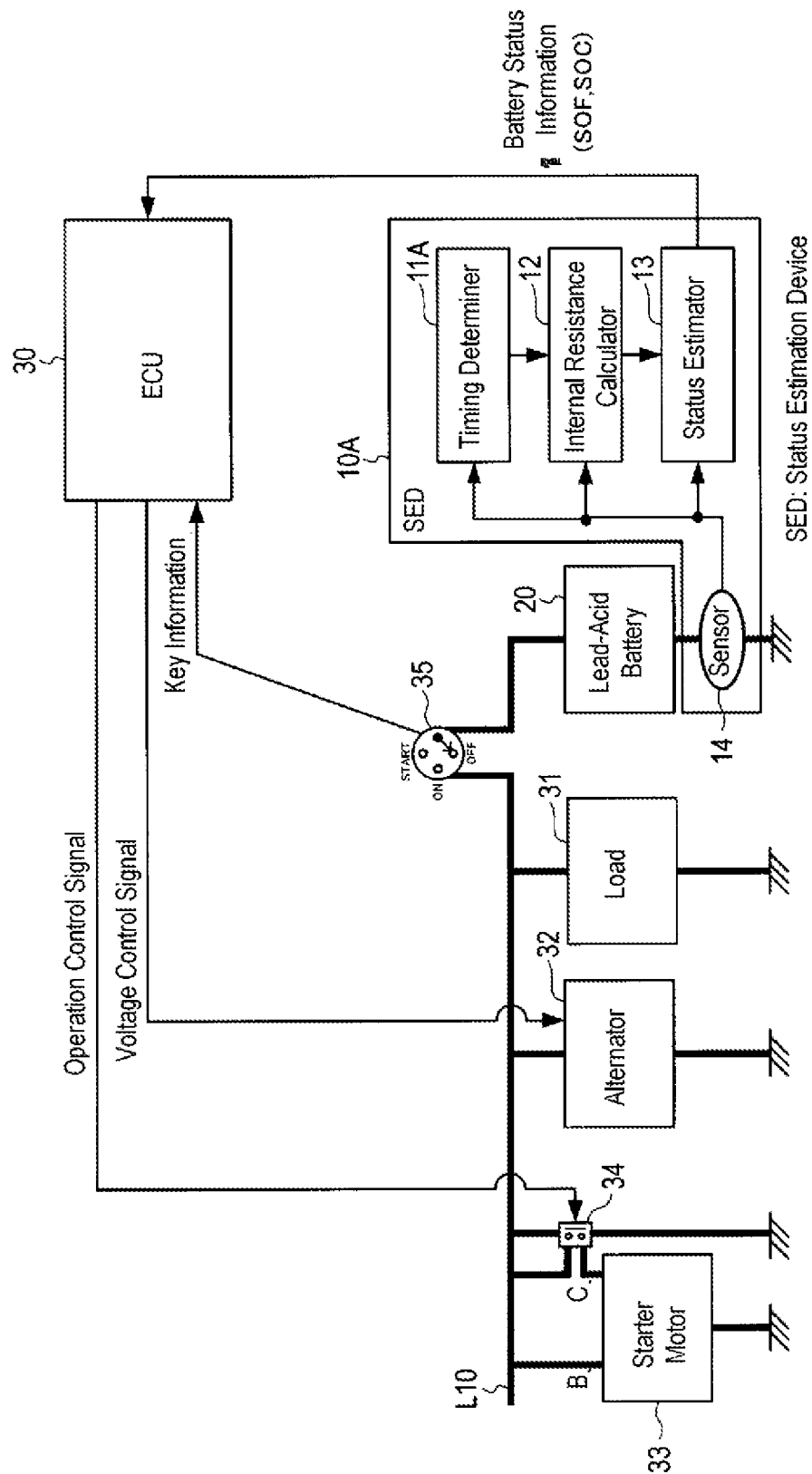
FIG. 5 is a block diagram illustrating a status estimation device according to a second exemplary embodiment of the present disclosure and a portion of a vehicle.

FIG. 5 is a block diagram illustrating status estimation device 10A according to a second exemplary embodiment and a portion of a vehicle.

Status estimation device 10A is the same as that of the first exemplary embodiment except for the input to timing determiner 11A. The same components are designated by the same reference characters, and the description thereof will be omitted.

Timing determiner 11A receives signals from sensor unit 14. Timing determiner 11A monitors the detection signal of either the voltage or the charge-discharge current detected by sensor unit 14, and determines the timing at which lead-acid battery 20 is discharged at the time of starting the engine (i.e., at the time of cranking). Then, the timing at which the engine starts can be notified to internal resistance calculator 12.

The calculation process of direct current internal resistance by internal resistance calculator 12 is the same as that in the first exemplary embodiment.

Thus, status estimation device 10A of the second exemplary embodiment makes it possible to perform the same status estimation as that in the first exemplary embodiment without receiving the start information from ECU 30 of the vehicle.

Third Exemplary Embodiment

Figure 6:
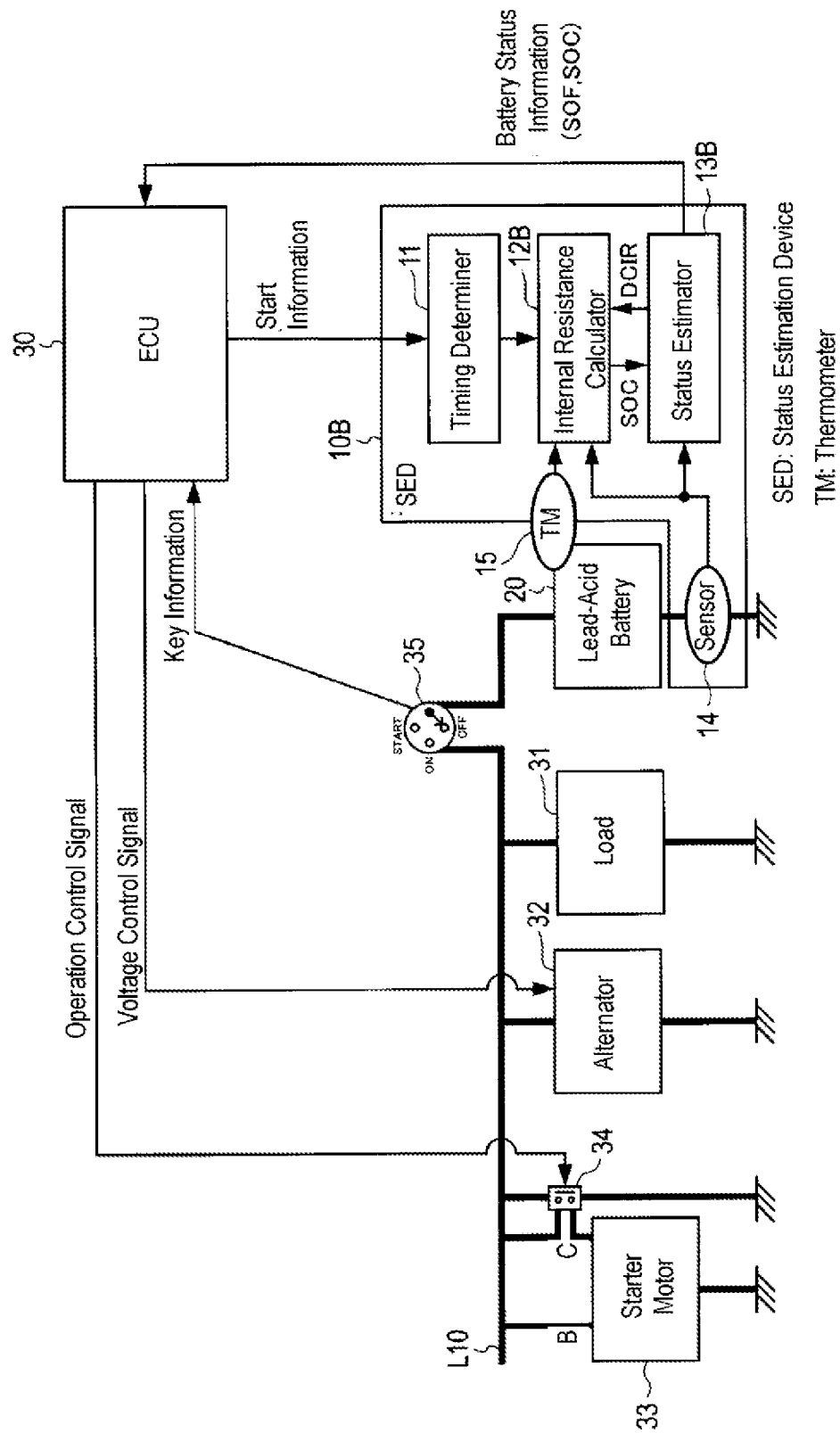
FIG. 6 is a block diagram illustrating a status estimation device according to a third exemplary embodiment of the present disclosure and a portion of a vehicle.

FIG. 6 is a block diagram illustrating status estimation device 10B according to a third exemplary embodiment and a portion of a vehicle.

Status estimation device 10B calculates the direct current internal resistance of lead-acid battery 20 additionally using the information of the temperature and state of charge (SOC) of lead-acid battery 20. The rest of the configuration is the same as that of the first exemplary embodiment. The same components as those in the first exemplary embodiment are designated by the same reference characters, and the description thereof will be omitted.

Status estimation device 10B includes timing determiner 11, internal resistance calculator 12B, status estimator 13B, sensor unit 14, and thermometer 15.

Internal resistance calculator 12B receives a detection signal from thermometer 15 and an estimation value of SOC from status estimator 13B when calculating the direct current internal resistance of lead-acid battery 20.

Although internal resistance calculator 12B performs the calculation of direct current internal resistance as described in the first exemplary embodiment, it does not calculate the direct current internal resistance if the temperature of the lead-acid battery is abnormally high or abnormally low. Moreover, internal resistance calculator 12B does not calculate the direct current internal resistance if the SOC is not within a predetermined range.

Thus, internal resistance calculator 12B does not perform the calculation of the direct current internal resistance in such cases where the temperature or the SOC of lead-acid battery 20 is outside the predetermined range where the estimation accuracy is poor. As a result, it is possible to increase the accuracy of calculating the direct current internal resistance and the accuracy of status estimating by status estimation device 10B.

Internal resistance calculator 12B may calculate the direct current internal resistance of lead-acid battery 20 using the open circuit voltage (OCV) of lead-acid battery 20 in place of SOC. Alternatively, internal resistance calculator 12B may calculate the direct current internal resistance of lead-acid battery 20 using any or all of the SOC, the OCV, and the temperature.

Furthermore, instead of the configuration in which internal resistance calculator 12B does not perform the calculation of the direct current internal resistance if the temperature, SOC, or OCV falls outside a predetermined range, internal resistance calculator 12B may correct the value of the calculated direct current internal resistance or the values of parameters for calculating the direct current internal resistance using the temperature, SOC, or OCV, to calculate the direct current internal resistance.

As described above, status estimation device 10B calculates the direct current internal resistance of lead-acid battery 20. The direct current internal resistance can deal with the time constant of an abrupt current change. Accordingly, status estimation device 10B can estimate, with high accuracy, the status of lead-acid battery 20 when high current is output.

Hereinabove, various exemplary embodiments of the present disclosure have been described.

Note that the present disclosure is not limited to the foregoing exemplary embodiments. For example, although the exemplary embodiments have illustrated a method of calculating the direct current internal resistance using a two-point method, it is also possible to calculate the direct current internal resistance using the voltages and charge-discharge currents at a plurality of timings within stable period T2 and the voltages and charge-discharge currents at a plurality of timings within allowable error periods T5 and T6 at the time of cranking at which high current is output, for example, with an I-V plot method.

In addition, the exemplary embodiments have shown, as the stable period T2, the stable period T2 that is the latter half of a period from the time when relay 34 is switched to ON to the time when a high current starts to flow into starter motor 33. Specifically, it is preferable that stable period T2 be a period between 10 ms earlier than the start timing at which electric power starts to be supplied to starter motor 33 and the start timing, inclusive.

In addition, for example, when lead-acid battery 20 has been left to stand for a long period of time, it is also possible that the stable period T2 may be set to be a period when the charge-discharge current and the voltage is substantially zero and stable before relay 34 is switched to ON, to detect the voltage and charge-discharge current.

Furthermore, although the exemplary embodiments have shown a lead-acid battery as an example of the secondary battery, it is also possible to use other types of secondary batteries, such as lithium-ion storage batteries and nickel-metal hydride storage batteries.

The exemplary embodiments have illustrated a method of calculating the direct current internal resistance of a secondary battery using the values detected at the time of cranking in an engine-powered vehicle. However, it is also possible that, for example, in an electric powered vehicle that is driven by a motor, the direct current internal resistance of a secondary battery may be similarly calculated using the values detected before and after the timing at which a high current is output at the time when the vehicle starts to travel.

It has been found that, as a result of an experiment, in gasoline-fueled vehicles, the waveform of the direct current internal resistance represented in FIG. 4 results in an almost uniform waveform, irrespective of cranking. For this reason, it is possible to determine and update the timing at which the voltage drops to the lowest voltage every time, or it is also possible to use a timing that was determined previously.

Furthermore, the specific configurations and methods described in the exemplary embodiments may be modified as appropriate without departing from the scope of the subject matter of the disclosure.

The present disclosure is applicable to, for example, a device for estimating the status of a secondary battery that is incorporated in a vehicle.

What is claimed is:

1. A secondary battery status estimation device comprising:
    a sensor unit configured to detect a terminal voltage and a charge-discharge current of a secondary battery; and
    an internal resistance calculator configured to calculate a direct current internal resistance of the secondary battery based on the terminal voltage and the charge-discharge current detected by the sensor unit,
    wherein:
        the internal resistance calculator calculates the direct current internal resistance based on the terminal voltage and the charge-discharge current that have been detected by the sensor unit, in a stable period and in a high-current output period,
        the stable period is before starting a driving source for driving a vehicle and the terminal voltage and the charge-discharge current of the secondary battery fall within a predetermined fluctuation range in the stable period,
        when starting the driving source, electric power for starting the driving source is output from the secondary battery and the terminal voltage of the secondary battery is brought to substantially minimum in the high-current output period,
        the secondary battery supplies electric power for switching a relay between open and close, the relay capable of supplying electric power to a starter motor of the vehicle, and
        the stable period is a latter half period of a period in which a current for switching the relay is output from the secondary battery so as to allow the electric power to be supplied to the starter motor.

2. The secondary battery status estimation device according to claim 1, wherein:
    the secondary battery supplies driving electric power to the starter motor of the vehicle in which an engine as the driving source is started up by driving of the starter motor; and
    the high-current output period is a period in which the terminal voltage of the secondary battery is brought to substantially minimum by starting the starter motor.

3. The secondary battery status estimation device according to claim 2, wherein the high-current output period is a period between 5 ms earlier and 15 ms later, inclusive, than a timing at which the terminal voltage of the secondary battery is minimum.

4. The secondary battery status estimation device according to claim 1, wherein the stable period is a period between 10 ms earlier than a start timing and the start timing at which electric power starts to be supplied to the starter motor, inclusive.

5. The secondary battery status estimation device according to claim 1, further comprising an additional sensor unit configured to detect at least one of a state-of-charge, an open circuit voltage, and a temperature of the secondary battery, wherein the internal resistance calculator calculates the direct current internal resistance further using a result detected by the additional sensor unit.

6. The secondary battery status estimation device according to claim 1, further comprising a state-of-function calculator configured to calculate a state-of-function of the secondary battery based on the calculated direct current 5 internal resistance and an open circuit voltage of the secondary battery.

7. A secondary battery status estimation method comprising:
    detecting, by a sensor unit, a terminal voltage and a charge-discharge current of a secondary battery; and
    calculating, by an internal resistance calculator, a direct current internal resistance of the secondary battery based on the detected terminal voltage and the detected charge-discharge current that is detected by the sensor unit, wherein:
        the direct current internal resistance is calculated, by the internal resistance calculator, based on the detected terminal voltage and the detected charge-discharge current, in a stable period and in a high-current output period,
        the stable period is before starting a driving source for driving a vehicle and the terminal voltage and the charge-discharge current of the secondary battery fall within a predetermined fluctuation range in the stable period, and
        when starting the driving source, electric power for starting the driving source is output from the secondary battery and the terminal voltage of the secondary battery is brought to substantially minimum in the high-current output period,
        the secondary battery supplies electric power for switching a relay between open and close, the relay capable of supplying electric power to a starter motor of the vehicle, and
        the stable period is a latter half period of a period in which a current for switching the relay is output from the secondary battery so as to allow the electric power to be supplied to the starter motor.

* * * * *